United States Patent
Frohberg et al.

(10) Patent No.: US 7,622,391 B2
(45) Date of Patent: Nov. 24, 2009

(54) METHOD OF FORMING AN ELECTRICALLY CONDUCTIVE LINE IN AN INTEGRATED CIRCUIT

(75) Inventors: Kai Frohberg, Niederau (DE); Thomas Werner, Moritzburg (DE); Ruo Qing Su, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 248 days.

(21) Appl. No.: 11/678,324

(22) Filed: Feb. 23, 2007

(65) Prior Publication Data

US 2008/0026564 A1    Jan. 31, 2008

(30) Foreign Application Priority Data

Jul. 31, 2006  (DE)  .................. 10 2006 035 645

(51) Int. Cl.
*H01L 21/311* (2006.01)

(52) U.S. Cl. .................. 438/702; 438/691; 438/692; 438/714; 438/720; 438/723; 257/E21.485

(58) Field of Classification Search ................ 438/691, 438/692, 700, 701, 702, 704, 705, 706, 714, 438/720, 723; 257/E21.485
See application file for complete search history.

(56) References Cited

U.S. PATENT DOCUMENTS

| | | | | |
|---|---|---|---|---|
| 4,943,539 | A | | 7/1990 | Wilson et al. ............ 437/195 |
| 5,619,071 | A | * | 4/1997 | Myers et al. ............ 257/753 |
| 5,629,579 | A | * | 5/1997 | Zimmerman ............ 313/309 |
| 5,817,572 | A | * | 10/1998 | Chiang et al. ............ 438/624 |
| 5,874,357 | A | | 2/1999 | Jun et al. ............ 438/638 |
| 5,874,358 | A | * | 2/1999 | Myers et al. ............ 438/640 |
| 6,169,010 | B1 | * | 1/2001 | Higashi ............ 438/396 |
| 6,218,283 | B1 | * | 4/2001 | Park et al. ............ 438/622 |
| 6,884,710 | B2 | * | 4/2005 | Park et al. ............ 438/614 |
| 7,192,871 | B2 | * | 3/2007 | Maekawa et al. ............ 438/695 |
| 2002/0086517 | A1 | * | 7/2002 | Barth et al. ............ 438/618 |
| 2003/0194872 | A1 | * | 10/2003 | Parikh et al. ............ 438/694 |

FOREIGN PATENT DOCUMENTS

EP   0 714 121 B1   11/1995

OTHER PUBLICATIONS

Translation of Official Communication from German Patent Office for German Patent Application No. 10 2006 035 645.4-33 dated Dec. 22, 2007.

* cited by examiner

*Primary Examiner*—George Fourson
*Assistant Examiner*—John M Parker
(74) *Attorney, Agent, or Firm*—Williams, Morgan & Amerson, P.C.

(57) ABSTRACT

A method of forming a semiconductor structure comprises providing a semiconductor structure comprising a layer of a dielectric material provided over an electrically conductive feature. An opening is formed in the layer of dielectric material. The opening is located over the electrically conductive feature and has a first lateral dimension. A cavity is formed in the electrically conductive feature. The cavity has a second lateral dimension being greater than the first lateral dimension. The cavity and the opening are filled with an electrically conductive material.

16 Claims, 7 Drawing Sheets

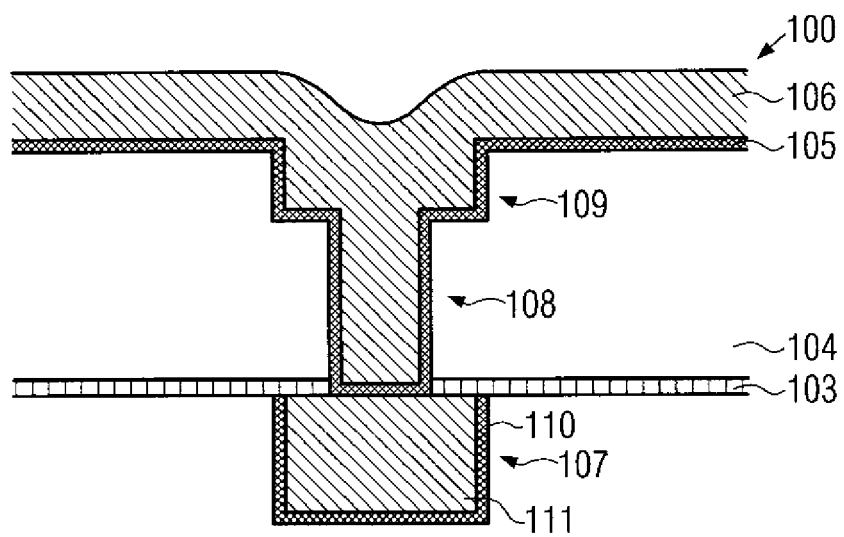
FIG. 1a
(prior art)
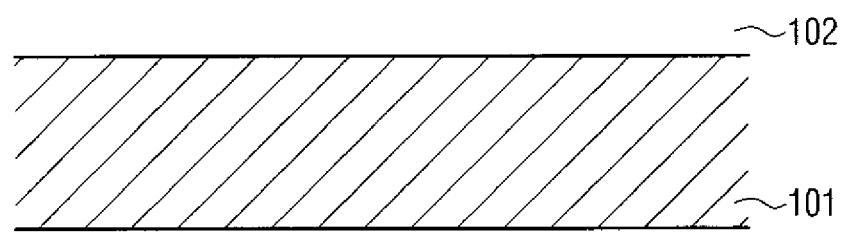
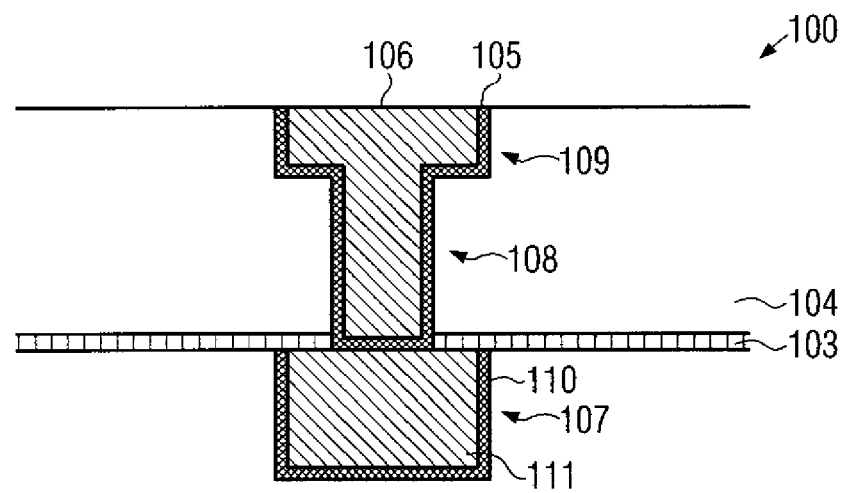
FIG. 1b
(prior art)
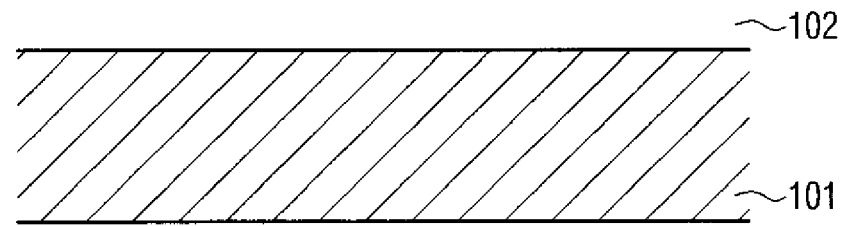

METHOD OF FORMING AN ELECTRICALLY CONDUCTIVE LINE IN AN INTEGRATED CIRCUIT

BACKGROUND OF THE INVENTION

1. Field of the Invention

The present disclosure relates to the formation of integrated circuits, and, more particularly, to the formation of electrically conductive lines provided in an integrated circuit.

2. Description of the Related Art

Integrated circuits comprise a large number of individual circuit elements, such as transistors, capacitors and resistors formed on and in a substrate. These elements are connected internally by means of electrically conductive lines to form complex circuits such as memory devices, logic devices and microprocessors. To accommodate all the electrically conductive lines required to connect the circuit elements in modern integrated circuits, the electrically conductive lines are arranged in a plurality of levels stacked on top of each other. To connect electrically conductive lines provided in different levels, contact vias are formed in dielectric layers separating the levels from each other. These vias are then filled with an electrically conductive material.

A method of forming an electrically conductive line according to the state of the art will now be described with reference to FIGS. 1a-1b. FIG. 1a shows a schematic cross-sectional view of a semiconductor structure 100 in a first stage of the method of forming an electrically conductive line according to the state of the art.

A semiconductor substrate 101 is provided. The semiconductor substrate 101 may comprise a plurality of circuit elements and, optionally, electrically conductive lines in lower interconnect levels. The semiconductor substrate 101 further comprises a first dielectric layer 102 formed thereon. A trench 107 is formed in the layer 102. In the trench 107, a trench fill 111 comprising an electrically conductive material, for example a metal such as copper, is provided. The trench fill 111 forms an electrically conductive line. A diffusion barrier layer 110 separates the trench fill 111 from the first dielectric layer 102. Thus, a diffusion of the material of the trench fill 111 into the first dielectric layer 102 can be prevented and an adhesion between the trench fill 111 and the dielectric material of the first dielectric layer 102 can be improved. The semiconductor substrate 101 can be formed by means of methods known to persons skilled in the art comprising advanced techniques of deposition, oxidation, ion implantation, etching and photolithography.

An etch stop layer 103 is formed over the semiconductor substrate 101. In addition to the surface of the first dielectric layer 102, the etch stop layer 103 covers an exposed top surface of the trench fill 111. A second dielectric layer 104 is formed on the etch stop layer 103. The second dielectric layer 104 may comprise the same material as the first dielectric layer 102. The etch stop layer 103 and the second dielectric layer 104 may be formed by means of methods known to persons skilled in the art, such as chemical vapor deposition, plasma enhanced chemical vapor deposition and spin coating.

A trench 109 and a contact via 108 are formed in the second dielectric layer 104. This can be done by photolithographically forming a mask (not shown) which exposes a portion of the surface of the second dielectric layer 104 at the location where the contact via 108 is to be formed. Then, an etching process is performed. To this end, the semiconductor structure 100 is exposed to an etchant adapted to selectively remove the material of the second dielectric layer 104, leaving the etch stop layer 103 essentially intact. Thus, the etching process stops as soon as the etch front reaches the etch stop layer 103.

The etching process may be anisotropic. In anisotropic etching, a rate at which material is removed from the etched surface depends on the orientation of the surface. The etch rate of substantially horizontal portions of the etched surface being substantially parallel to the surface of the semiconductor substrate 101 is significantly greater than the etch rate of inclined portions of the etched surface. Thus, substantially no material below the mask is removed and the via 108 obtains substantially vertical sidewalls. Thereafter, the mask is removed, which can be done by means of a resist strip process known to persons skilled in the art, and the trench 109 is formed. Similar to the formation of the contact via 108, the trench 109 can be formed by photolithographically forming a mask on the semiconductor structure 100 and performing an anisotropic etching process.

Subsequently, a portion of the etch stop layer 103 exposed at the bottom of the contact via 108 is removed. The exposed portion of the etch stop layer 103 can be removed by means of an etching process adapted to selectively remove the material of the etch stop layer 103, leaving the materials of the second dielectric layer 103 and the trench fill 111 substantially intact.

A diffusion barrier layer 105 is deposited on the semiconductor structure 100. In particular, the diffusion barrier layer 105 covers the sidewalls and the bottom of the trench 109 and the contact via 108. This can be done by means of known methods such as chemical vapor deposition, plasma enhanced chemical vapor deposition and/or sputter deposition. Then, a layer 106 of an electrically conductive material is formed on the diffusion barrier layer 105. To this end, methods of electroplating known to persons skilled in the art may be employed.

FIG. 1b shows a schematic cross-sectional view of the semiconductor structure 100 in a further stage of the method of forming an electrically conductive line according to the state of the art.

The surface of the semiconductor structure 100 is planarized, for example, by means of a known chemical mechanical polishing process. In the planarization, portions of the diffusion barrier layer 105 and the layer 106 outside the trench 109 and the contact via 108 are removed and a planar surface of the semiconductor structure 100 is obtained. Residues of the layer 106 in the trench 109 form an electrically conductive line. Residues of the layer 106 in the contact via 108 provide an electrical contact between the electrically conductive lines in the trench 109 and the trench 107.

A problem of the semiconductor structure 100 is that an adhesion between the layer 106 of electrically conductive material in the contact via 108, the diffusion barrier layer 105 and/or the trench fill 111 may be relatively low. When the chemical mechanical polishing process is performed to remove the portions of the diffusion barrier 105 and the layer 106 outside the trench 109 and the contact via 108, mechanical stress may be created in the semiconductor structure 100. Moreover, mechanical stress may be created in the semiconductor structure 100 in later steps of the manufacturing of the semiconductor structure 100 or the operation of the semiconductor structure 100. In the operation of the semiconductor structure 100, heat may be created due to the electrical resistivity of the materials in the trench 107, the contact via 108 and the trench 109. Since the thermal expansion coefficient of individual materials in the semiconductor structure 100 may be different, the creation of heat may lead to mechanical stress in the semiconductor structure 100. Such mechanical stress may lead to a separation of the layer 106 of electrically conductive material in the contact via 108, the diffusion barrier layer 105 and/or the trench fill 111 which may adversely affect the functionality of the semiconductor structure 100 and may even lead to a failure thereof.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment disclosed herein, a method of forming a semiconductor structure comprises providing a semiconductor substrate comprising a layer of a dielectric material provided over an electrically conductive feature. An opening is formed in the layer of dielectric material. The opening is located over the electrically conductive feature and has a first dimension in a lateral direction. The lateral direction is substantially parallel to a surface of the layer of dielectric material. A cavity is formed in the electrically conductive feature. The cavity has a second dimension in the lateral direction. The second dimension is greater than the first dimension. The cavity and the opening are filled with an electrically conductive material.

According to another illustrative embodiment, a method of forming a semiconductor structure comprises providing a semiconductor substrate comprising a layer of a dielectric material provided over an electrically conductive feature. The layer of dielectric material comprises an opening being located over the electrically conductive feature. A first etching process is performed to form a recess in the electrically conductive feature. The first etching process is adapted to remove a material of the electrically conductive feature. A protective layer is formed over the first portion of the recess. A second portion of the recess is not covered by the protective layer. A second etching process is performed. The second etching process is adapted to remove the material of the electrically conductive feature at a greater etch rate than a material of the protective layer.

According to a further illustrative embodiment, a method of forming a semiconductor structure comprises providing a semiconductor substrate comprising at least one layer of a dielectric material provided over an electrically conductive feature. An opening is formed in the at least one layer of dielectric material. The opening has a first portion and a second portion, the second portion being located at a greater distance from the electrically conductive feature than the first portion. The first portion has a first dimension in a lateral direction. The lateral direction is substantially parallel to a surface of the at least one layer of dielectric material. The second portion has a second dimension in the lateral direction. The first dimension is greater than the second dimension. The opening is filled with an electrically conductive material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b show schematic cross-sectional views of a semiconductor structure in stages of a method of forming an electrically conductive line according to the state of the art;

Figure 2A:
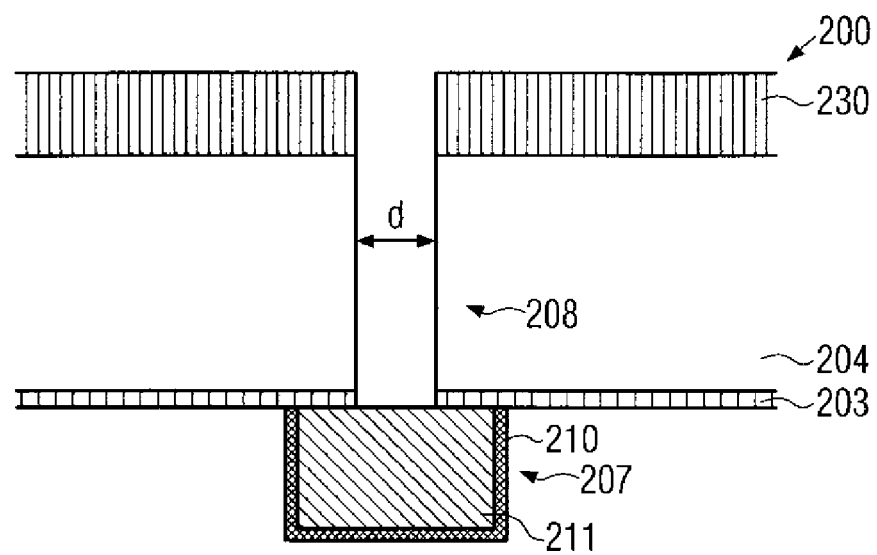
FIGS. 2a-2d show schematic cross-sectional views of a semiconductor structure in stages of a method of forming an electrically conductive line according to an embodiment disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein relates to methods of forming a semiconductor structure wherein an electrically conductive line providing electrical connection between electrically conductive features formed above each other comprises a first portion having a greater lateral dimension than a second portion, wherein the second portion is provided at a greater distance to the lower one of the electrically conductive features. While in some embodiments, the first portion of the electrically conductive line is provided inside the lower one of the electrically conductive features and the second portion is provided in an interlayer dielectric, in other embodiments, both the first and the second portion of the electrically conductive line can be provided in the interlayer dielectric. Due to the different lateral dimensions of the first and the second portion of the electrically conductive line, the electrically conductive line may have the functionality of a rivet or other like structure, thus improving the mechanical stability of the semiconductor structure.

FIG. 2a shows a schematic cross-sectional view of a semiconductor structure 200 in a first stage of a method of forming a semiconductor structure. The semiconductor structure 200 comprises a semiconductor substrate 201. The semiconductor substrate 201 may comprise circuit elements, such as transistors, capacitors and resistors, formed on a semiconductor wafer. Moreover, in some embodiments, the semiconductor substrate 201 can comprise a plurality of electrically conductive lines in one or more lower interconnect levels.

The semiconductor substrate 201 further comprises a first dielectric layer 202 formed thereon. In the first dielectric layer 202, an electrically conductive feature is formed, provided in the form of a trench 207 filled with an electrically conductive trench fill 211. A diffusion barrier layer 210 separates the trench fill 211 from the first dielectric layer 202 and is adapted to increase an adhesion between the trench fill 211 and the first dielectric layer 202 as well as to substantially prevent a diffusion of the material of the trench fill 211 into the first dielectric layer 202.

The first dielectric layer 202 may comprise one of a variety of known dielectric materials including silicon dioxide, silicon nitride, and low-k-materials such as silicon oxycarbide or hydrogen silsesquioxane. The trench fill 211 may comprise copper and the diffusion barrier layer 210 can comprise tantalum and/or tantalum nitride. In some embodiments, the diffusion barrier layer 210 may comprise a plurality of sublayers composed of different materials. The semiconductor substrate 201 can be formed by various methods well known to persons skilled in the art, e.g., deposition, oxidation, ion implantation, etching and/or photolithography.

An etch stop layer 203 and a second dielectric layer 204 are deposited on the first dielectric layer 202. The second dielectric layer 204 may comprise the same material as the first dielectric layer 202. In other embodiments, the first dielectric layer 202 and the second dielectric layer 204 can comprise different materials. The etch stop layer 203 may comprise SiN, SiC, or SiCN, or other materials. In the deposition of the etch stop layer 203 and the second dielectric layer 204, deposition methods known to persons skilled in the art such as chemical vapor deposition, plasma enhanced chemical vapor deposition and/or spin coating may be employed.

A contact via 208 is formed in the second dielectric layer 204. The contact via 208 may be formed by photolithographically forming a mask 230 on the second dielectric layer 204 and then performing an anisotropic etching process. In the etching process, an etchant adapted to selectively remove the material of the second dielectric layer 204, leaving the material of the etch stop layer 203 substantially intact, is used. Thus, the etching process stops as soon as the etch stop layer 203 is exposed at the bottom of the contact via 208.

After the formation of the contact via 208, the portion of the etch stop layer 203 exposed at the bottom of the contact via 208 is removed. This can be done by means of an etching process known to persons skilled in the art. Moreover, the mask 230 can be removed by means of a resist strip process known to persons skilled in the art.

The contact via 208 has a dimension "d" in a lateral direction being substantially parallel to the surface of the second dielectric layer 204 and/or an interface between the second dielectric layer 204 and the etch stop layer 203 and/or an interface between the etch stop layer 203 and the first dielectric layer 202. In the following, dimensions of features in the lateral direction will sometimes be denoted as "lateral dimension." In some embodiments, the contact via 208 may have a substantially cylindrical shape. In such embodiments, the lateral dimension "d" can correspond to a diameter of the contact via 208.

Figure 2B:
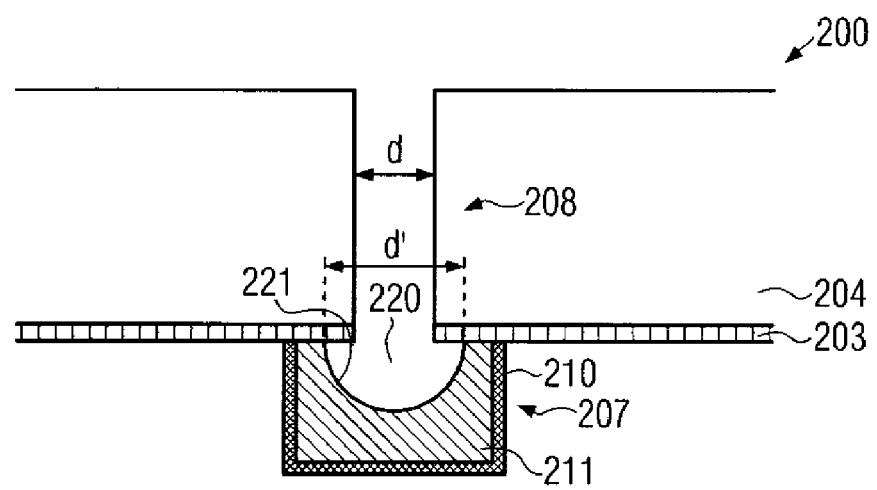

FIG. 2b shows a schematic cross-sectional view of the semiconductor structure 200 in a later stage of the manufacturing process. A cavity 220 is formed in the trench fill 211. This can be done by means of an etching process adapted to selectively remove the material of the trench fill 211, leaving the dielectric material of the second dielectric layer 204 and, optionally, a material of the etch stop layer 203 substantially intact. The etching process can be isotropic.

In some embodiments, the cavity 220 may be formed by means of a dry etching process. In dry etching, a radio frequency glow discharge produces a chemically reactive species, such as atoms, radicals and ions, from a relatively inert molecular gas. The etching gas is selected such that the generated species reacts chemically with the material to be etched, creating a volatile reaction product. An energy of ions impinging on the semiconductor structure 200 may be controlled by varying a frequency applied in creating the glow discharge and/or applying a DC bias to the semiconductor structure 200. In general, the greater the energy of the ions, the more anisotropic or directional the etching process. In embodiments wherein the etching process is isotropic, a relatively low DC bias or no DC bias at all may be applied.

In embodiments wherein the trench fill 211 comprises copper, the dry etching process may be performed by means of an etching gas comprising a mixture of ammonia ($NH_3$) and water ($H_2O$). In other embodiments, the etching gas may comprise chlorine ($Cl_2$). A uniformity of the etching of copper may be improved by exposing the semiconductor structure 200 to a beam of ions prior to the etching process. Thus, copper at the surface of the trench fill 211 may be amorphized. This may help overcome problems resulting from a dependence of the etch rate of copper on grain orientation.

In further embodiments, the cavity 220 may be formed by means of a wet chemical etching process. In such embodiments, the etching process may be performed by inserting the semiconductor structure 200 into an aqueous solution of iron (III)-chloride ($FeCl_3$). Typically, wet etching processes are isotropic.

In still further embodiments, the cavity 220 can be formed by means of a sputter etching process. In sputter etching, ions of a sputtering gas, for example positively charged argon ions ($Ar^+$), are created. This can be done by means of an electric discharge in the sputtering gas. The ions are accelerated towards the semiconductor structure 200. When the ions impinge on the semiconductor structure 200, atoms are ejected from the surface of the semiconductor structure 200.

In particular, material at the surface of the trench fill 211 exposed at the bottom of the contact via 208 is removed by the bombardment with ions.

In the etching process, portions of the trench fill 211 below the second dielectric layer 204 and/or the etch stop layer 203 are removed. In particular, this is the case if the etching process applied in the formation of the cavity 222 is isotropic or if an anisotropic etching process having a relatively low degree of anisotropy is employed, since in isotropic etching processes or anisotropic etching processes having a relatively low degree of anisotropy, a removal of material of the trench fill 211 occurs both in a lateral direction and in a vertical direction being substantially perpendicular to the lateral direction.

Therefore, a dimension d' of the cavity 220 in the lateral direction can be greater than the dimension d of the contact via in the lateral direction. Moreover, in embodiments wherein the cavity 220 is formed by means of an isotropic etching process or an anisotropic etching process having a low degree of anisotropy, the cavity 220 may be formed with a rounded bottom surface 221. In such embodiments, the cavity 220 may have the shape of an upside down mushroom head. In some embodiments, the cavity 220 may extend under a portion of the etch stop layer 203.

Figure 2C:
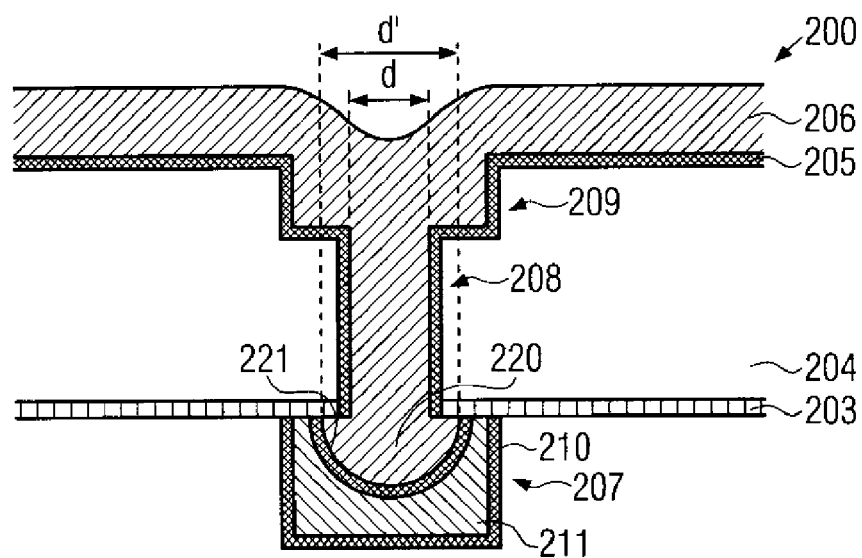

FIG. 2c shows a schematic cross-sectional view of the semiconductor structure 200 in a later stage of the manufacturing process. A trench 209 may be formed in the second dielectric layer 204. Similar to the method of forming an electrically conductive line according to the state of the art described above with reference to FIGS. 1a and 1b, the trench 209 can be formed by means of a known photolithographic process wherein a mask (not shown) having openings at those portions of the second dielectric layer 204 where the trench 109 is to be formed is provided over the semiconductor structure 200 and an etching process is carried out in order to remove material from the portions of the second dielectric layer 204 exposed at the openings of the mask.

The trench 209 need not be formed after the formation of the contact via 208 and the cavity 220. In some embodiments, the trench 209 may be formed after the formation of the contact via 208 and before the formation of the cavity 220. In other embodiments, the trench 209 can be formed before the formation of both the contact via 208 and the cavity 220.

A diffusion barrier layer 205 is formed over the semiconductor structure 200. The diffusion barrier layer 205 covers the bottom surface 221 of the cavity 220, the side surface of the contact via 208, the bottom surface of the trench 209 and the sidewalls of the trench 209. The diffusion barrier layer 205 need not cover the whole bottom surface 221 of the cavity 220 as shown in FIG. 2c. In other embodiments, the diffusion barrier layer 205 may only partially cover the bottom surface 221 of the cavity 220. Since the cavity 220 abuts the trench fill 211 in the trench 207, and a diffusion of the trench fill 211 out of the trench 207 is prevented by the barrier 210, a complete coverage of the bottom surface 221 of the cavity 220 by the diffusion barrier layer 205 may not be necessary in order to prevent a diffusion of electrically conductive material to be deposited in the cavity 220.

The diffusion barrier layer 205 may further cover the horizontal top surface of the second dielectric layer 204. Similar to the formation of the diffusion barrier layer 105 in the method of forming an electrical connection described above with reference to FIGS. 1a and 1b, the diffusion barrier layer 205 can be formed by means of deposition techniques known to persons skilled in the art, such as chemical vapor deposition, plasma enhanced chemical vapor deposition and/or sputter deposition.

The cavity 220, the contact via 208 and the trench 209 are filled with an electrically conductive material, for example, a metal such as copper. The cavity 220, the contact via 208 and the trench 209 may be filled by means of an electroplating process. To this end, a seed layer (not shown) comprised of the electrically conductive material can be formed on the diffusion barrier layer 205. In some embodiments, the seed layer can be formed by means of a sputtering process wherein a target comprising the electrically conductive material is irradiated with ions. Due to the impact of ions on the target, atoms are ejected from the target. The ejected atoms may then be deposited on the surface of the semiconductor structure 200.

In other embodiments, the seed layer can be formed by means of an electroless deposition process. In electroless deposition, the semiconductor structure 200 is inserted into an aqueous plating solution. Solvents in the plating solution undergo a redox reaction with the material of the diffusion barrier layer 205. In the redox reaction, the electrically conductive material is formed. Further products of the redox reaction pass into a solved state in the plating solution and are thus removed from the semiconductor structure 200.

Advantageously, an electroless deposition of the seed layer allows a greater degree of isotropy of the deposition process. Thus, the seed layer may be reliably formed on steep portions of the semiconductor structure 200 such as, e.g., the sidewalls of the contact via 208 and the trench 209.

After the formation of the seed layer, the semiconductor structure 200 is inserted into a plating solution and an electric voltage is applied between the seed layer and an electrode comprised of the electrically conductive material. A polarity of the electric voltage is such that, on average, the electrode becomes an anode and the semiconductor structure 200 becomes a cathode. Thus, at the electrode, atoms of the electrically conductive material are positively charged and change from the solid state in the electrode into a dissolved state in the plating solution. On the surface of the semiconductor structure 200, the ions are discharged and change from the solved state to the solid state. Thus, in the course of time, the layer 206 of the electrically conductive material is formed.

Figure 2D:
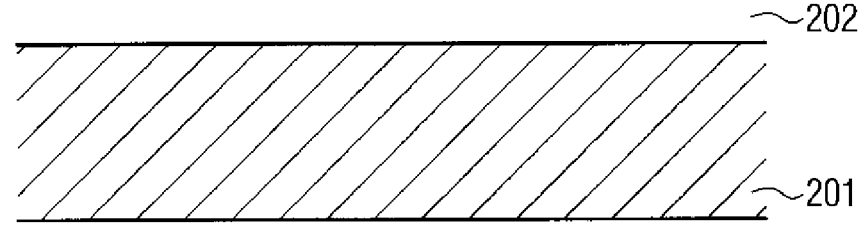

A schematic cross-sectional view of the semiconductor structure 200 in a later stage of the method of forming a semiconductor structure is shown in FIG. 2d. A planarization process is performed. The planarization process can comprise a chemical mechanical polishing process. In chemical mechanical polishing, the semiconductor structure 200 is moved relative to a polishing pad. A slurry comprising a chemical compound adapted to react with the material of the diffusion barrier layer 205 and the layer 206 of electrically conductive material is supplied to an interface between the semiconductor structure 200 and the polishing pad. The reaction products are removed by means of abrasives contained in the slurry and/or the polishing pad.

After the planarization, the semiconductor structure 200 comprises a substantially flat surface. The diffusion barrier layer 205 and the layer 206 of electrically conductive material are present in the trench 209, the contact via 208 and the cavity 220. The electrically conductive material in the trench 209 forms an electrically conductive line, whereas the electrically conductive material in the contact via 208 and the cavity 220 provides an electrical connection between the electrically conductive lines in the trenches 207, 209.

The electrically conductive line between the trenches 207, 209 has a narrow portion in the contact via 208. The narrow portion has a lateral dimension corresponding to the lateral dimension d of the contact via 208 and a wider portion in the cavity 220 which has a lateral dimension corresponding to the lateral dimension d' of the cavity 220. When a mechanical force acts on the electrically conductive line in the direction away from the trench fill 211, a motion of the electrically conductive line into this direction is prevented by the portion of the electrically conductive line in the cavity 220 which abuts to the etch stop layer 203 and/or the second dielectric layer 204, thus acting as an anchorage. Therefore, a separation of the electrically conductive line from the trench fill 211 and/or the portion of the diffusion barrier layer 205 formed at the bottom of the cavity 220 can be prevented. Thus, the mechanical stability of the semiconductor structure 200 can be improved compared to the semiconductor structure 100 according to the state of the art described above with reference to FIGS. 1a and 1b.

Further embodiments will be described with reference to FIGS. 3a-3c. For convenience, the same reference numerals will be used in order to denote features corresponding to those in the embodiments described above with reference to FIGS. 2a-2d.

Figure 3A:
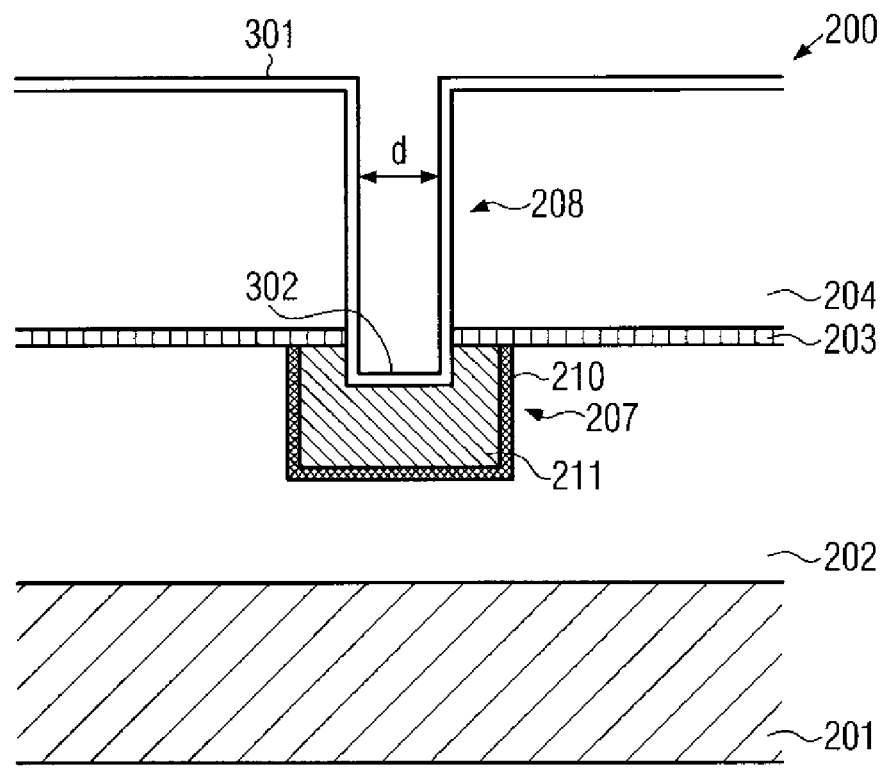
FIGS. 3a-3c show schematic cross-sectional views of a semiconductor structure in stages of a method of forming an electrically conductive line according to another embodiment disclosed herein.

FIG. 3a shows a schematic cross-sectional view of a semiconductor structure 200 in a first stage of a manufacturing process. The semiconductor structure 200 comprises a substrate 201. A first dielectric layer 202, an etch stop layer 203 and a second dielectric layer 204 are formed on the substrate 201. A trench 207 filled with a trench fill 211 forming an electrically conductive line is formed in the first dielectric layer. A diffusion barrier layer 210 separates the trench fill 211 from the first dielectric layer 201.

In the second dielectric layer 204, a contact via 208 located over the trench 207 is formed as described above with reference to FIGS. 2a-2d. After the formation of the contact via 208, a portion of the etch stop layer 203 at the bottom of the contact via 208 can be removed to expose the trench fill 211. The contact via 208 has a lateral dimension d.

A recess 302 is formed in the trench fill 211 at the bottom of the contact via 208. This can be done by means of an etching process adapted to selectively remove the material of the trench fill 211 while substantially not affecting the material of the second dielectric layer 204. As will be explained in more detail below, a material layer 301 may be formed over the semiconductor structure 200.

The etching process used in the formation of the recess 302 can have a moderately high degree of anisotropy such that a dimension of the recess 302 in a lateral direction, being substantially parallel to the surface of the second dielectric layer 204 and/or the interface between the second dielectric layer 204 and the etch stop layer 203 and/or the interface between the etch stop layer 203 and the first dielectric layer 202, is substantially equal to the dimension d of the contact via 208 in the lateral direction.

Similar to the formation of the cavity 220 in the embodiments described above with reference to FIGS. 2a-2d, the recess 302 can be formed by means of a dry etching process and/or a sputter etch process. In the case of a dry etching process, a degree of anisotropy of the etching process can be controlled by varying a frequency applied in the creation of the radio frequency glow discharge and/or a DC bias applied to the semiconductor structure 200. In particular, a moderately large DC bias can be applied in order to create a relatively high degree of anisotropy. In the case of a sputter etch process, a degree of anisotropy can be controlled by varying the energy of ions directed to the semiconductor structure 200, wherein a greater energy of the ions leads to a greater degree of anisotropy of the etching process.

Figure 3B:
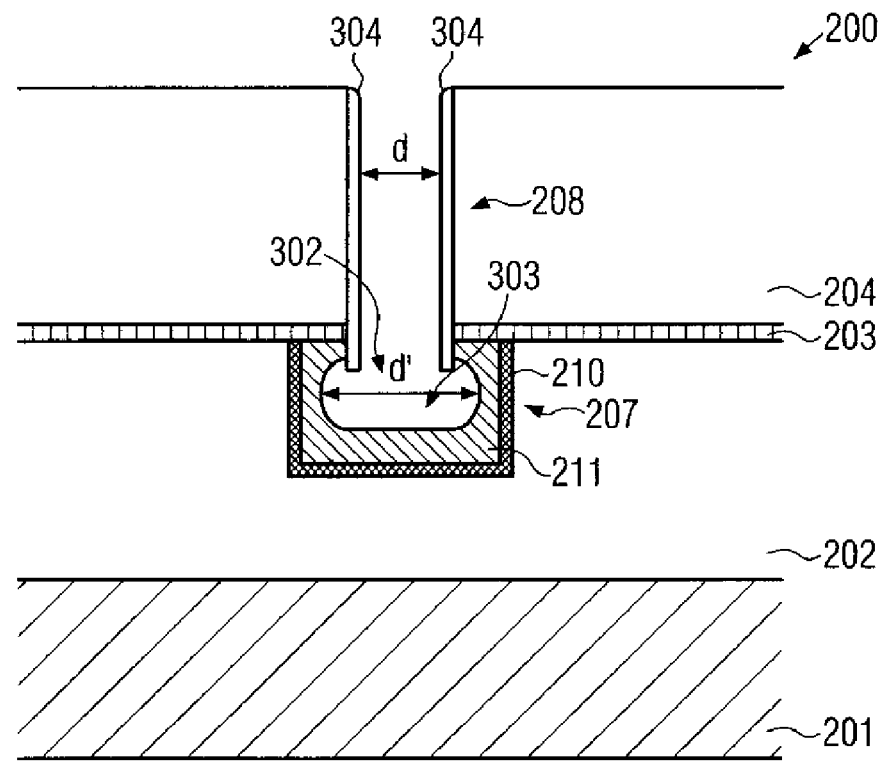

A schematic cross-sectional view of the semiconductor structure 200 in a later stage of the manufacturing process is shown in FIG. 3b. A protective layer 304 is formed over a first portion of the recess 302. A second portion of the recess 302 is not covered by the protective layer 304. The first portion of the recess 302 can comprise a sidewall of the recess 302, while the second portion of the recess 302 may comprise a bottom of the recess 302.

In the formation of the protective layer 304, a material layer 301 (FIG. 3a) is deposited over the semiconductor structure 200. To this end, a deposition process of a type known to persons skilled in the art, such as chemical vapor deposition and/or plasma enhanced chemical vapor deposition, can be employed. The deposition process can be isotropic such that a thickness of the material layer 301 over substantially horizontal portions of the semiconductor structure is substantially equal to a thickness of the material layer 301 over substantially vertical portions of the semiconductor structure 200 such as the sidewalls of the recess 302 and the contact via 208.

The material layer 301 can comprise an electrically conductive material different from the material of the trench fill 211. For example, the material layer 301 may comprise tantalum and/or tantalum nitride. In other embodiments, the material layer 301 can comprise a dielectric material such as silicon dioxide and/or silicon nitride.

After the deposition of the material layer 301, an anisotropic etching process, for example, a known dry etching process, is performed. In the anisotropic etching process, an etch rate of substantially horizontal portions of the material layer 301, for example, of portions on the surface of the second dielectric layer 204 and, in particular, on the bottom surface of the recess 302, is greater than an etch rate of substantially vertical portions of the material layer 204 such as portions on the sidewalls of the contact via 208 and the recess 302.

The anisotropic etching process is stopped as soon as the portion of the material layer 301 on the bottom of the recess 302 is removed and the trench fill 211 is exposed at the bottom of the recess 302. Due to the anisotropy of the etching process, portions of the material layer 301 remain on the sidewalls of the recess 302 and, optionally, also on the sidewalls of the contact via 208 and form the protective layer 304.

A cavity 303 is formed at the bottom of the recess 302. To this end, an etching process adapted to remove the material of the trench fill 211 at a greater etch rate than the material of the protective layer 304 can be performed. The etching process is further adapted to leave the material of the second dielectric layer 204 substantially intact. Due to the smaller etch rate of the material of the protective layer 304, the protective layer 304 can be consumed only partially during the etching process or may not be substantially consumed at all. Thus, the protective layer 304 protects those portions of the trench fill 211 which are covered by the protective layer 304 from being affected by the etchant used in the etching process. Hence, substantially no etching occurs at the sidewall of the recess 302. At the bottom of the recess 302, the etchant contacts the material of the trench fill. Therefore, a portion of the trench fill 211 at the bottom of the recess 302 is etched away and the cavity 303 is formed.

The etching process used in the formation of the cavity 303 may have a lower degree of anisotropy than the etching process used in the formation of the recess 302 or may be substantially isotropic. Thus, portions of the trench fill below the protective layer 404 and/or the second dielectric layer 204 can be removed such that the cavity 303 extends laterally beyond the recess 302 and has a dimension d' in the lateral direction which is greater than the lateral dimension d of the contact via. The etching process can be a dry etching process, a sputter etch process or a wet etch process.

Since the cavity 303 is formed at the bottom of the recess 302, the cavity 303 can be spaced apart from the etch stop layer 203 and the second dielectric layer 204 and may be provided inside the trench fill 211.

Figure 3C:
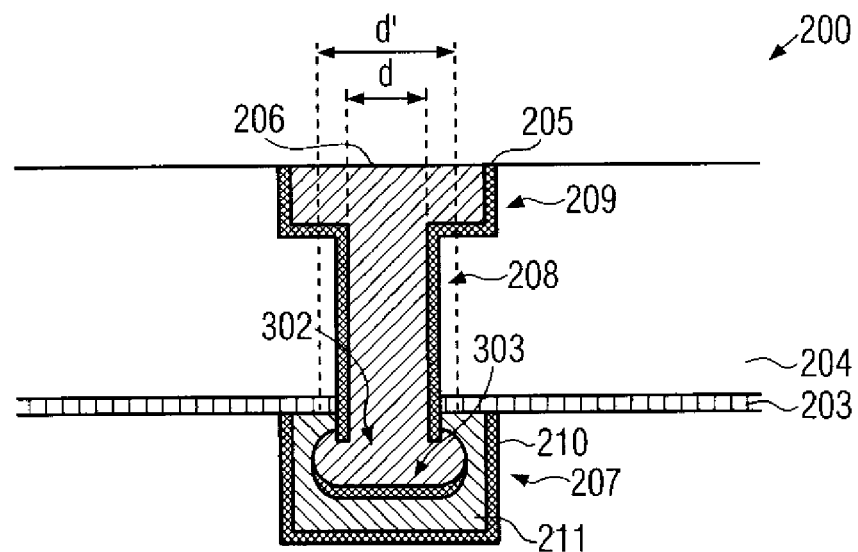

FIG. 3c shows a schematic cross-sectional view of the semiconductor structure 200 in a later stage of the manufacturing process. In some embodiments disclosed herein, the protective layer 304 may be removed after the formation of the cavity. A removal of the protective layer 304 is particularly advantageous in embodiments wherein the protective layer 304 comprises an electrically insulating material. Thus, an adverse influence of the presence of the electrically insulating protective layer on the electrical connection between the trench fill 211 and an electrically conductive line to be formed in the contact via 208 may be advantageously avoided. In other embodiments, the protective layer 304 may remain on the semiconductor structure 200.

A trench 209 is formed in the semiconductor structure 200. This can be done by means of photolithographic techniques known to persons skilled in the art. Similar to the embodiments described above with reference to FIGS. 2a-2d, the trench may alternatively be formed before the formation of the recess 302 and the cavity 303 and/or before the formation of the contact via 208.

A diffusion barrier layer 205 and a layer of electrically conductive material 206 are deposited over the semiconductor structure 200 and a chemical mechanical polishing process is performed to remove portions of the diffusion barrier layer 205 and the layer of electrically conductive material 206 outside the trench 209, the contact via 208, the recess 302 and the cavity 303.

Portions of the layer of electrically conductive material 206 in the contact via 208, the recess 302 and the cavity 303 form an electrically conductive line which provides an electrical connection between the trenches 207, 209. Since the lateral dimension d' of the portion of the electrically conductive line inside the cavity 330 is greater than the lateral dimension d of the portion of the electrically conductive line in the contact via 208, the electrically conductive line is fixed inside the trench fill 211. Since the cavity 303 is provided at the bottom of the recess 302 and, therefore, the trench fill partially surrounds the cavity 303, a particularly stable anchoring of the electrically conductive line in the trench fill 211 may be obtained.

Portions of an electrically conductive line having a greater lateral dimension than other portions of the electrically conductive line need not be formed inside the trench fill 211. In other embodiments disclosed herein, such portions may be formed in a layer of a dielectric material, such as the second dielectric layer 204. In the following, such embodiments will be described with reference to FIGS. 4, 5a, 5b and 6.

Figure 4:
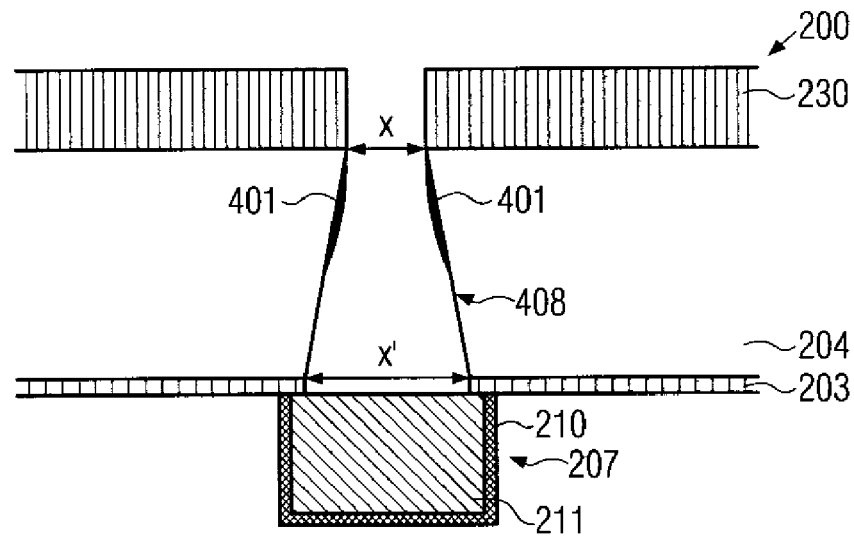
FIG. 4 shows a schematic cross-sectional view of a semiconductor structure in a stage of a method of forming a semiconductor structure according to yet another embodiment disclosed herein.

FIG. 4 shows a schematic cross-sectional view of a semiconductor structure 200 in a stage of a manufacturing process according to an embodiment disclosed herein. The semiconductor structure 200 comprises a substrate 201, a first dielectric layer 202, an etch stop layer 203, a second dielectric layer 204 and a trench 207 formed in the first dielectric layer 207. The trench 207 comprises a trench fill 211 separated from the first dielectric layer 202 by a diffusion barrier layer 210.

In the second dielectric layer 204, a contact via 408 is formed. A first portion of the contact via 408 located adjacent the trench fill 211 has a first lateral dimension x', whereas a second portion of the contact via 408 located adjacent the surface of the second dielectric layer 204 has a second lateral dimension x which is smaller than the first lateral dimension x'. The second portion of the contact via 208 having the lateral dimension x is located at a greater distance from the trench 207 and the trench fill 211 than the first portion of the contact via 208 having the lateral dimension x'.

The contact via 408 may be formed as follows. A mask 230 is formed over the semiconductor structure 200. The mask 230 has an opening located over the trench 207. The mask 230 can be formed by means of techniques of photolithography well known to persons skilled in the art.

Then, a dry etching process is performed. The dry etching process is adapted to simultaneously deposit a protective layer 401 over the upper sidewalls of already formed portions of the contact via 408.

To this end, a composition of the etchant gas used in the dry etching process may be adapted such that a solid material is formed in the glow discharge occurring in the etching gas, which solid material is then deposited on the upper sidewall portions of the contact via 408 and forms the protective layer 401. A formation of solid material on the bottom of the contact via 408 may be substantially prevented by the impact of ions arriving from a vertical direction substantially perpendicular to the surface of the second dielectric layer 204. During the etching process, the protective layer 401 may reduce a contact between the etchant gas and the sidewalls of the contact via 408 such that a further removal of material from the upper sidewalls of the contact via 408 is also reduced. In the course of the etching process, the thickness of the protective layer 401 may increase. The thicker the protective layer 401 becomes, the more effective it is in protecting the upper sidewall portions of the contact via 408 from being affected by the etchant gas. Therefore, the protective layer 401 may substantially prevent or at least significantly reduce a further removal of material from the upper sidewall portions of the contact via 408 in later phases of the etching process.

In the period of time between the formation of a portion of the sidewall and the point of time when the protective layer 401 has obtained a sufficient thickness over the respective portion of the sidewall to substantially prevent or significantly reduce the removal of material from the sidewall, etching of the sidewall may occur, which entails an increase of the lateral dimension of the respective portion of the contact via 408. Therefore, an increase of the lateral dimension of the contact via 408 may occur in the vicinity of the bottom sidewall portions of the contact via 408. A shadowing of portions of the bottom surface of the contact via 408 may be avoided by adapting a DC bias and/or other parameters of the dry etching process such that a substantially isotropic etching or a relatively low anisotropy of the etching process is obtained. Hence, a removal of material may occur at substantially the whole bottom surface of the contact via 408. Due to the further increase of the lateral dimension of the contact via 408 in the period of time between the formation of a portion of the sidewall and the point of time when the protective layer 401 over the respective portion of the sidewall has obtained a sufficient thickness to substantially prevent or significantly reduce the removal of material from the sidewall, the lateral dimension of the contact via 408 may grow as the etch front proceeds towards the trench 207. Consequently, portions of the contact via 408 in the vicinity of the trench 207 can obtain a greater lateral dimension than portions of the contact via 408 located at a greater distance to the trench 207.

In some embodiments disclosed herein, the protective layer 401 may comprise a polymer material. In such embodiments, the etch gas can comprise $CHF_3$ and $CF_4$, wherein a greater fraction of $CHF_3$ may lead to an increased deposition of polymer material on the sidewalls of the contact via 408.

After the formation of the contact 408, the mask 230 may be removed by means of a known resist strip process. Moreover, the protective layer 401 can be removed by a known dry or wet etching process. Then, similar to the embodiments described above, a trench similar to the trench 209 may be formed over the trench 207, and the contact via 408, as well as the trench, can be filled with an electrically conductive material separated from the second dielectric layer 204 and/or the trench fill 211 by a diffusion barrier layer to form an electrically conductive line in the contact via 408.

Portions of the electrically conductive line in the vicinity of the trench 207 have a greater lateral dimension than portions of the electrically conductive line in the vicinity of the surface of the second dielectric layer 204. In case a mechanical force acts on the electrically conductive line in a direction away from the trench 207, the greater lateral dimension of the portions of the electrically conductive line in the vicinity of the trench 207 may prevent a separation of the electrically conductive line from the trench fill 211 and/or portions of the diffusion barrier layer 205 over the trench fill 211. Thus, the mechanical stability of the semiconductor structure 200 can be improved.

Figure 5A:
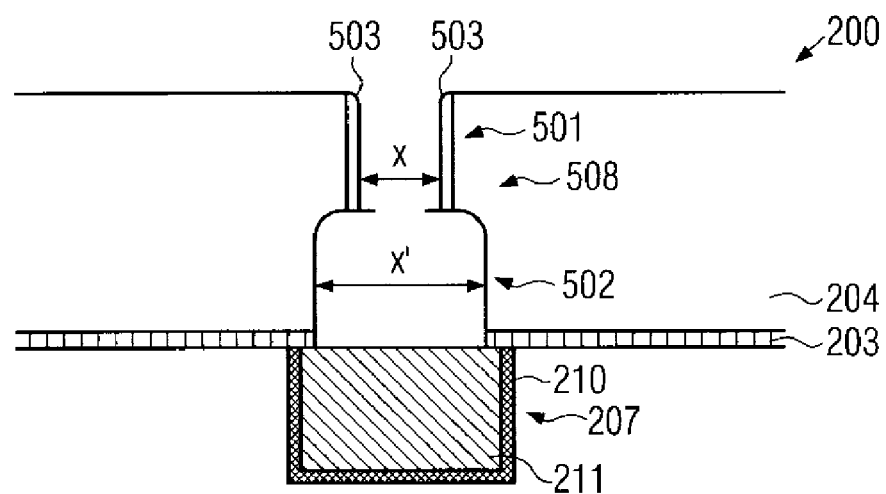
FIGS. 5a-5b show schematic cross-sectional views of a semiconductor structure in stages of a method of forming a semiconductor structure according to yet another embodiment disclosed herein.

FIG. 5a shows a schematic cross-sectional view of a semiconductor structure 200 in a first stage of the manufacturing process. Similar to other embodiments described above, the semiconductor structure 200 comprises a substrate 201 over which a first dielectric layer 202, an etch stop layer 203 and a second dielectric layer 204 are formed. In the first dielectric layer 202, a trench 207 filled with a trench fill 211, which is separated from the first dielectric layer 202 by a diffusion barrier layer 210, is formed.

A contact via 508 is formed in the second dielectric layer 204. The contact via 508 comprises a first portion 502 and a second portion 501. The second portion 501 is located at a greater distance from the trench 207 and the trench fill 211 than the first portion 502. Moreover, a lateral dimension x of the second portion 501 of the contact via 508 is smaller than a lateral dimension x' of the first portion 502 of the contact via 508.

The contact via 508 may be formed as follows. A mask similar to the mask 230 having an opening over the trench 207 is formed over the semiconductor structure 200. Then, an anisotropic etching process is performed to form the second portion 501 of the contact via 508.

After the formation of the second portion 501 of the contact via 508, a protective layer 503 can be formed over the sidewall of the second portion 501 of the contact via 508. Similar to the formation of the protective layer 304 in the embodiments described above with reference to FIGS. 3a and 3b, this can be done by isotropically depositing a material layer over the semiconductor structure 200 and anisotropically etching the material layer until portions of the material layer on the bottom of the second portion 501 of the contact via 508 are removed. In the anisotropic etching process, the portions of the material layer on the bottom of the second portion 501 of the contact via 508 are etched at a greater etch rate than portions of the material layer on the sidewalls thereof. Hence, after the removal of the material layer from the bottom of the second portion 501, residues of the material layer remain on the sidewalls of the second portion 501. These residues form the protective layer 503.

Thereafter, a second etching process is performed to form the first portion 502 of the contact via 508. The second etching process, which can be a dry etching process, is adapted to remove the material of the second dielectric layer 204 at a greater etch rate than the material of the protective layer 503. Thus, the material of the protective layer 503 is affected by the etchant to a less extent that the material of the second dielectric layer 204 or may not be substantially affected by the etchant at all. Thus, at least a portion of the protective layer 503 may remain on the semiconductor structure 200 during the second etching process, preventing an etchant used in the second etching process from affecting the sidewalls of the second portion 501 of the contact via 508. Hence, the first portion 501 of the second contact via 508 maintains its lateral dimension x during the second etching process.

A degree of anisotropy of the second etching process may be lower than a degree of anisotropy of the first etching process. In some embodiments disclosed herein, the second etching process may be substantially isotropic. Thus, portions of the second dielectric layer 204 below the protective layer 503 and also portions of the second dielectric layer 204 adjacent the second portion 501 of the contact via 508 may be removed in the second etching process, and the first portion 502 of the contact via 508 obtains a lateral dimension x' which is greater than the lateral dimension x of the first portion 501. After the formation of the first portion 502 of the contact via 508, the etch stop layer 203 may be removed from the bottom of the contact via 508.

Figure 5B:
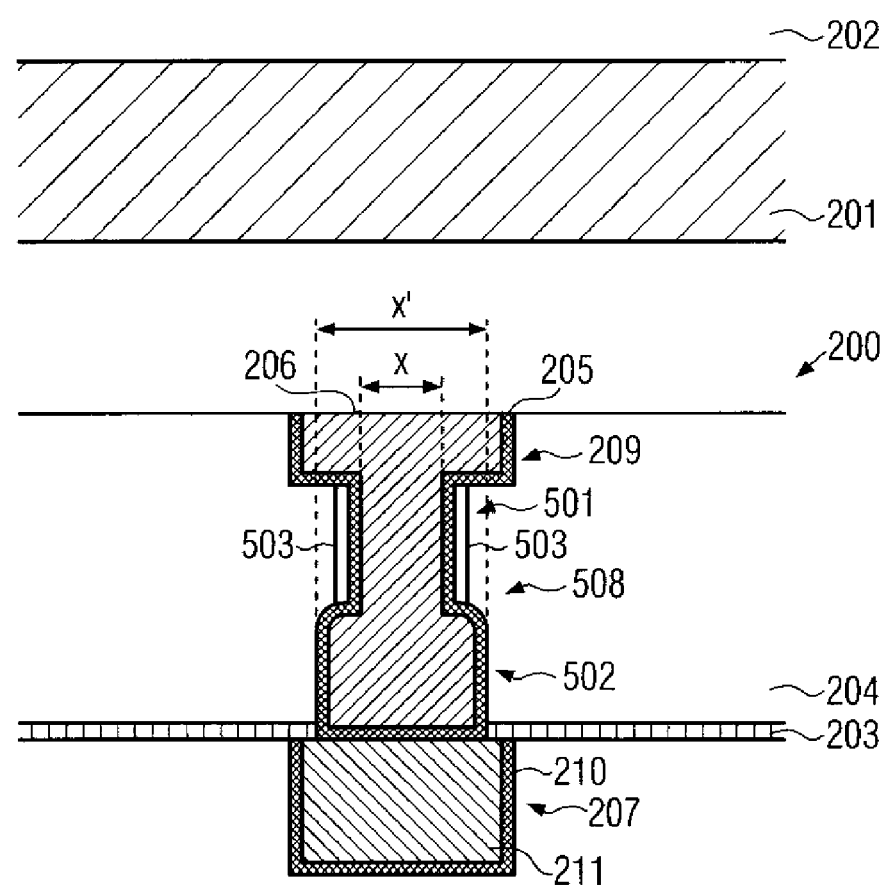

FIG. 5b shows a schematic cross-sectional view of the semiconductor structure 200 in a later stage of the manufacturing process. A trench 209 can be formed over the trench 207. While, in some embodiments disclosed herein, the trench 209 is formed after the formation of the contact via 508 as described above, in other embodiments, the trench 209 may be formed before the formation of the contact via 508. The formation of the trench 207 can be performed by means of photolithographic techniques well known to persons skilled in the art.

A diffusion barrier layer 205 and a layer of an electrically conductive material 206 are deposited over the semiconductor structure 200. Thereafter, a planarization process can be performed to remove portions of the diffusion barrier layer 205 and the layer of electrically conductive material 206 from the surface of the second dielectric layer 204. Thus, electrically conductive lines are formed in the trench 209 and the contact via 508, wherein the electrically conductive line in the contact via 508 provides an electrical contact between the electrically conductive line in the trench 209.

The greater lateral dimension x' of the first portion 502 of the contact via 508 compared to the lateral dimension x of the second portion 501 of the contact via 508 allows improved mechanical stability of the semiconductor structure 200 compared to the semiconductor structure 100 according to the state of the art described above with reference to FIGS. 1a-1b.

Figure 6:
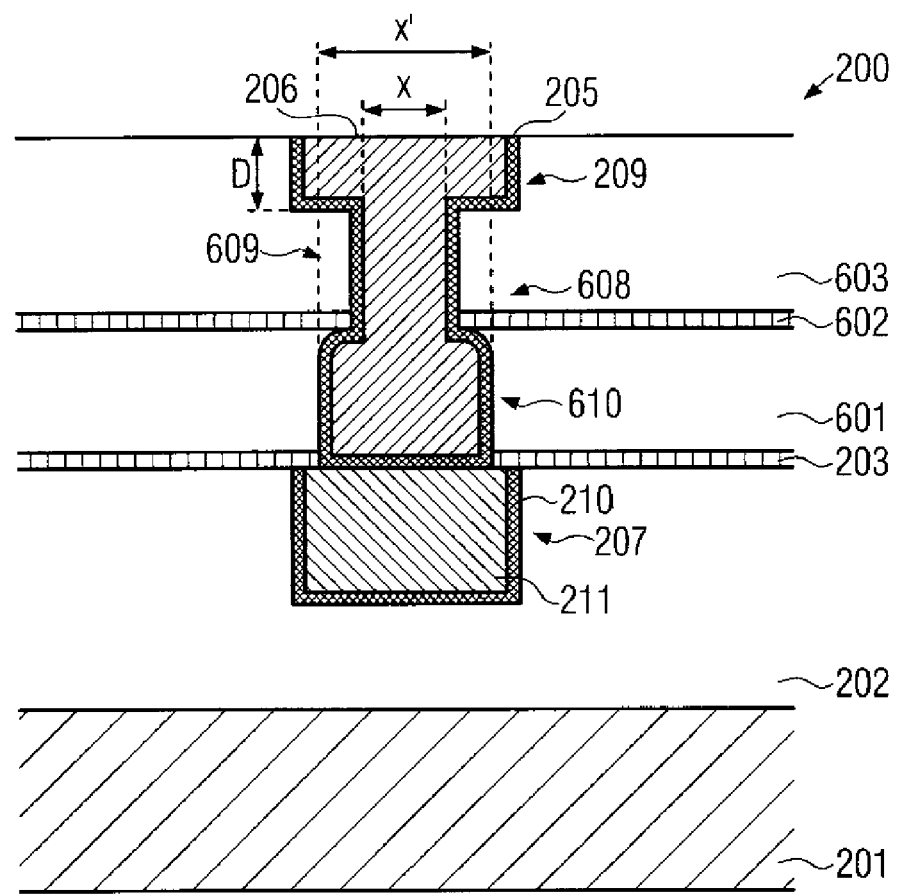
FIG. 6 shows a schematic cross-sectional view of a semiconductor structure in a stage of a method of forming a semiconductor structure according to yet another embodiment disclosed herein.

FIG. 6 shows a schematic cross-sectional view of a semiconductor structure 200 in a stage of a manufacturing process. Similar to the other embodiments described above, the semiconductor structure 200 comprises a semiconductor substrate 201. A first dielectric layer 202 is formed on the substrate 201. A trench 207 filled with a trench fill 211, which is separated from the first dielectric layer 202 by a diffusion barrier layer 210, is formed in the first dielectric layer 202. A first etch stop layer 203 can be provided on the first dielectric layer 202 and the trench fill 211.

A second dielectric layer 601 and a third dielectric layer 603, which may be separated from each other by a second etch stop layer 602, are formed over the first etch stop layer 203 and the first dielectric layer 202. In some embodiments, however, the second etch stop layer 602 can be omitted. The second dielectric layer 601 and the third dielectric layer 603 may comprise different materials. A material of the second etch stop layer 602 may be different from a material of the second dielectric layer 601 and the third dielectric layer 603.

A contact via 608 is formed in the second dielectric layer 601 and the third dielectric layer 603. The contact via 608 comprises a first portion 610 and a second portion 609, wherein the second portion 609 is located at a greater distance from the trench 207 and the trench fill 211 than the first portion 610. A lateral dimension x' of the first portion 610 is greater than a lateral dimension x of the second portion 609.

The formation of the contact via 608 may be performed as follows. A first etching process is performed to form the second portion 609 of the contact via 608. Prior to the first etching process, a mask similar to the mask 230 (FIGS. 2a and 4) may be formed over the semiconductor structure 200.

The first etching process can be an anisotropic etching process and may be adapted such that the material of the second etch stop layer 602 is substantially not affected by an etchant used in the first etching process. Thus, the removal of material stops as soon as the etch front reaches the bottom of the second portion 609 of the contact via 608.

In other embodiments disclosed herein wherein the second etch stop layer 602 is omitted, the second etching process may be adapted to selectively remove the material of the third dielectric layer 603 and to leave a material of the second dielectric layer 601 substantially intact.

After the first etching process, a portion of the second etch stop layer 602 at the bottom of the second portion 609 of the contact via 608 can be removed to expose the second dielectric layer 601. This can be done by means of methods well known to persons skilled in the art.

Thereafter, a second etching process is performed to form the first portion 610 of the contact via 608. The second etching process which, in some embodiments, can be a dry etch process, is adapted to selectively remove a material of the second dielectric layer 601, leaving the material of the third dielectric layer 603 substantially intact. Hence, during the second etching process, the lateral dimension x of the second portion 609 of the contact via 608 may be substantially maintained.

A degree of anisotropy of the first etching process can be greater than a degree of anisotropy of the second etching process. In some embodiments, the second etching process may be substantially isotropic. Due to the lower degree of anisotropy of the second etching process, portions of the second dielectric layer 601 under portions of the third dielectric layer 603 adjacent the sidewalls of the second portion 609 of the contact via 608 can be removed such that the first portion 610 obtains a lateral dimension x' which is greater than the lateral dimension x of the second portion 601.

After the second etching process, a trench 209 can be formed in the third dielectric layer 603. A depth D of the trench 209 can be smaller than a thickness of the third dielectric layer 603 such that a part of the second portion 609 of the contact via 608 remains in the semiconductor structure 200, connecting the trench 209 and the first portion 602 of the contact via 608. In other embodiments, the trench 209 can be formed before the formation of the contact via 608.

Similar to the other embodiments disclosed herein, a diffusion barrier layer 205 and a layer of electrically conductive material 206 can be deposited over the semiconductor structure 200, and a planarization process can be performed to remove portions of the diffusion barrier layer 205 and the layer of electrically conductive material 206 from the surface of the third dielectric layer 603. Thus, electrically conductive lines are formed in the trench 209 and the contact via 608. A portion of the electrically conductive line in the first portion 610 of the contact via 608 substantially has the lateral dimension x' of the first portion 610 and a portion of the electrically conductive line in the second portion 609 of the contact via 608 substantially has the smaller lateral dimension x of the second portion 609. Thus, the semiconductor structure 200 advantageously has a greater mechanical stability than the semiconductor structure 100 according to the state of the art described above with reference to FIGS. 1a-1b.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a semiconductor structure, comprising:
    providing a semiconductor substrate comprising a layer of a dielectric material provided over an electrically conductive feature, said layer of dielectric material comprising an opening being located over said electrically conductive feature;
    performing a first etching process to form a recess in said electrically conductive feature, said first etching process being adapted to remove a material of the electrically conductive feature;
    forming a protective layer over a first portion of said recess, a second portion of said recess not being covered by said protective layer; and
    performing a second etching process, said second etching process being adapted to remove the material of the electrically conductive feature at a greater etch rate than a material of the protective layer.

2. The method of claim 1, wherein a degree of anisotropy of said first etching process is greater than a degree of anisotropy of said second etching process.

3. The method of claim 1, wherein said first etching process is an anisotropic etching process.

4. The method of claim 1, wherein said second etching process is an isotropic etching process.

5. The method of claim 1, wherein said first portion of said recess comprises a sidewall of said recess and wherein said second portion of said recess comprises a bottom of said recess.

6. The method of claim 1, wherein said formation of said protective layer comprises:
    depositing a material layer comprising the material of the protective layer over said semiconductor structure;
    performing an anisotropic etching process adapted to remove a portion of the material layer located over the second portion of the recess at a greater etch rate than a portion of the material layer located over the first portion of the recess; and
    stopping said anisotropic etching process upon removal of said portion of said material layer located over said second portion of said recess.

7. A method of forming a semiconductor structure, comprising:
    providing a semiconductor substrate comprising at least one layer of a dielectric material provided over an electrically conductive feature;
    forming an opening in said at least one layer of dielectric material, said opening having a first portion and a second portion, said second portion being located at a greater distance from said electrically conductive feature than said first portion, said first portion having a first dimension in a lateral direction, said lateral direction being substantially parallel to a surface of said layer of dielectric material, said second portion having a second dimension in said lateral direction, said first dimension being greater than said second dimension, wherein said formation of said opening comprises:

performing a first etching process to form said second portion of said opening;

forming a protective layer over a sidewall of said second portion of said opening, at least a portion of a bottom of the second portion of the opening not being covered by said protective layer; and performing a second etching process to form said first portion of said opening, said second etching process being adapted to remove a material of said at least one layer of dielectric material at a greater etch rate than a material of said protective layer; and filling said opening with an electrically conductive material.

8. The method of claim 7, wherein a degree of anisotropy of said first etching process is greater than a degree of anisotropy of said second etching process.

9. The method of claim 7, wherein said first etching process is anisotropic and said second etching process is isotropic.

10. The method of claim 7, wherein said formation of said protective layer comprises:

isotropically depositing a material layer comprising a material of said protective layer over said semiconductor substrate;

performing an anisotropic etching process adapted to remove a first portion of said material layer located over said sidewall of said second portion of said second opening at a smaller etch rate than a second portion of said material layer located on said bottom of said second portion of said opening; and stopping said anisotropic etching process upon a removal of said second portion of said material layer.

11. The method of claim 7, wherein said at least one layer of dielectric material comprises a first layer of dielectric material and a second layer of dielectric material, said first layer of dielectric material being formed over said electrically conductive feature, said second layer of dielectric material being formed over said first layer of dielectric material, and wherein said formation of said opening comprises:

performing a first etching process to form said second portion of said opening in said second layer of dielectric material; and after said first etching process, performing a second etching process to form said first portion of said opening in said first layer of dielectric material, wherein said second etching process is adapted to remove a material of said first layer of dielectric material, leaving said second layer of dielectric material substantially intact.

12. The method of claim 11, wherein a degree of anisotropy of said first etching process is greater than a degree of anisotropy of said second etching process.

13. The method of claim 11, wherein said first etching process is anisotropic and said second etching process is isotropic.

14. A method of forming a semiconductor structure, comprising:

providing a semiconductor substrate comprising at least one layer of a dielectric material provided over an electrically conductive feature;

forming an opening in said at least one layer of dielectric material, said opening having a first portion and a second portion, said second portion being located at a greater distance from said electrically conductive feature than said first portion, said first portion having a first dimension in a lateral direction, said lateral direction being substantially parallel to a surface of said layer of dielectric material, said second portion having a second dimension in said lateral direction, said first dimension being greater than said second dimension, wherein said at least one layer of dielectric material comprises a first layer of dielectric material and a second layer of dielectric material, said first layer of dielectric material being formed over said electrically conductive feature, said second layer of dielectric material being formed over said first layer of dielectric material, and wherein said formation of said opening comprises:

performing a first etching process to form said second portion of said opening in said second layer of dielectric material; and after said first etching process, performing a second etching process to form said first portion of said opening in said first layer of dielectric material, wherein said second etching process is adapted to remove a material of said first layer of dielectric material, leaving said second layer of dielectric material substantially intact; and filling said opening with an electrically conductive material.

15. The method of claim 14, wherein a degree of anisotropy of said first etching process is greater than a degree of anisotropy of said second etching process.

16. The method of claim 14, wherein said first etching process is anisotropic and said second etching process is isotropic.

* * * * *